(12) United States Patent
Brown

(10) Patent No.: US 7,259,591 B1
(45) Date of Patent: Aug. 21, 2007

(54) MULTI-BIT CONFIGURATION PINS

(75) Inventor: Ray Brown, Bracknell (GB)

(73) Assignee: LSI Corporation, Milpitas, CA (US)

( * ) Notice: Subject to any disclaimer, the term of this patent is extended or adjusted under 35 U.S.C. 154(b) by 41 days.

(21) Appl. No.: 11/366,735

(22) Filed: Mar. 2, 2006

(51) Int. Cl.
*H03K 19/0175* (2006.01)

(52) U.S. Cl. ............................. 326/82; 326/83; 326/37; 326/30

(58) Field of Classification Search .................. 326/30, 326/37, 41, 47, 82–83; 327/108–112
See application file for complete search history.

(56) References Cited

U.S. PATENT DOCUMENTS 5,600,271 A * 2/1997 Erickson et al. ............ 327/108
5,684,411 A * 11/1997 Nepple ........................ 326/38

\* cited by examiner

*Primary Examiner*—Anh Q. Tran
(74) *Attorney, Agent, or Firm*—Christopher P. Maiorana, PC

(57) ABSTRACT

An apparatus comprising a first circuit and a second circuit. The first circuit may be configured to generate a data input signal in response to a first control signal and a second control signal. The second circuit may be configured to (i) generate the first control signal and the second control signal and (ii) determine whether the first circuit is coupled to (a) a first logic level circuit when in a first state and (b) an impedance circuit and a second logic level circuit when in a second state.

20 Claims, 4 Drawing Sheets

MULTI-BIT CONFIGURATION PINS

FIELD OF THE INVENTION

The present invention relates to a semiconductor device generally and, more particularly, to a method and/or apparatus having multi-bit configuration pins.

BACKGROUND OF THE INVENTION

Semiconductor devices often use a common silicon device to provide different or varying levels of functionality. Such differences in functionality are needed to support the use of the silicon device in different target environments. The use of the silicon device in a different target environment includes changing the address of the silicon device as seen on a control bus.

When extra functionality is added to a semiconductor device as the design of semiconductor evolves, it is necessary that the semiconductor device functions identically in a system to a previous part with no changes to the printed circuit board (PCB) layout. Such a change may be achieved by software. However, with other systems there may not be a controlling host device. Due to a lack of a controlling device, configuration pins provide a solution. Common silicon is often configurable by connecting one or more pins to a high or low logic level. In small standard packages, there may not be enough available pins to allow all of the necessary configuration settings, especially for test modes. When a part is an upgrade of a previous product with additional functionality, the pin count must remain the same, but the additional functionality will still need to be switched on or off. Where the added functionality is needed, a board change is acceptable. However, when it is necessary to maintain backward compatibility, the device packaging cannot be changed. Testing purposes provides another case where extra modes are needed. Changes to the board layout for testing purposes are not significant.

Adding more configuration pins to a part where no pins are available or using existing spare pins will allow more device configurations to be selected. However, adding more configuration pins to a part will increase the need to change existing board layouts. As the package changes the parts will become non-interchangeable. Standard packages and the correct number of pins may not be available. In small devices, the cost of the packaging is a significant part of the overall product cost.

It would be desirable to provide a method and/or apparatus that implements multi-bit configuration pins to eliminate the need to change existing board layouts and eliminate non-interchangeable standard packages.

SUMMARY OF THE INVENTION

The present invention concerns an apparatus comprising a first circuit and a second circuit. The first circuit may be configured to generate a data input signal in response to a first control signal and a second control signal. The second circuit may be configured to (i) generate the first control signal and the second control signal and (ii) determine whether the first circuit is coupled to (a) a first logic level circuit when in a first state and (b) an impedance circuit and a second logic level circuit when in a second state.

The objects, features and advantages of the present invention include providing to reduce the number of dedicated semiconductor device configuration pins that may (i) increase the number of configuration states, (ii) determine components that are connected to a pin and/or (iii) prevent reverse engineering of a semiconductor device.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
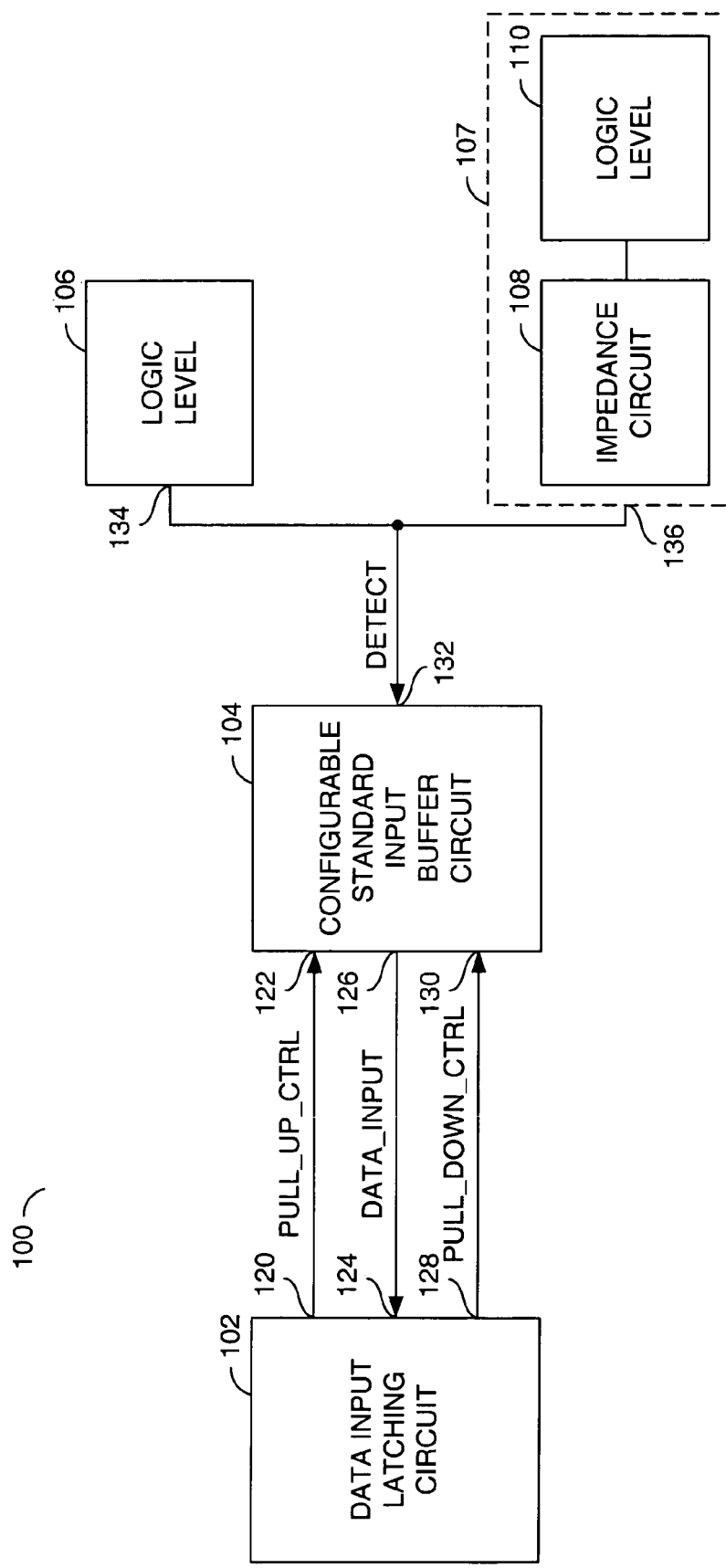
FIG. 1 is a block diagram of the present invention.

Referring to FIG. 1, a block diagram of a system 100 is shown in accordance with a preferred embodiment of the present invention. The system 100 generally comprises a block (or circuit) 102, a block (or circuit) 104, a block (or circuit) 106, a block (or circuit) 107. The circuit 102 may be implemented as a data input latching circuit. The circuit 104 may be implemented as an input buffer circuit. The circuit 104 may also be implemented as an I/O cell circuit. The circuit 106 may be implemented as a logic level circuit. The circuit 107 may be implemented as a logic circuit. The logic circuit 107 generally comprises a block (or circuit) 108 and a block (or circuit) 110. The circuit 108 may be implemented as an impedance circuit. The circuit 110 may be implemented as a logic level circuit. In one example, the circuit 108 may be implemented as a high impedance circuit. In one example, the logic level circuit 106 and the logic level circuit 110 may be the same logic level circuit. The data input latching circuit 102 may have an input 124 that may receive a signal (e.g., DATA INPUT), an output 120 that may present a signal (e.g., PULL_UP_CTRL), and an output 128 that may present a signal (e.g., PULL_DOWN_CTRL). The input buffer circuit 104 may have an input 122 that may receive the signal PULL_UP_CTRL, an input 130 that may receive the signal PULL_DOWN_CTRL and an input 132 that may receive a signal (e.g., DETECT). The input buffer circuit 104 may have an output 126 that may present the signal DATA_INPUT and an output 132 that may present a signal (e.g., DETECT). The logic level circuit 106 may have an output 134 that may present the signal DETECT. The logic circuit 107 may have an output 136 that may present the signal DETECT.

The data input latching circuit 102 may determine whether the input buffer circuit 104 is connected to (i) the logic level circuit 106 while in a first state or (ii) the impedance circuit 108 and the logic level circuit 110 while in a second state over the signal DETECT. In general, the input buffer circuit 104 may be connected to either (i) the logic level circuit 106 during a reset sequence or (ii) the impedance circuit 108 and the logic level circuit 110 for each reset sequence. The impedance circuit 108 may couple the buffer circuit 104 to the logic level circuit 110. The impedance circuit 108 generally comprises a high impedance resistance. The value of the high impedance resistance may be 100K ohms or greater. However, other resistance values may be implemented to meet the design criteria of a particular implementation.

Figure 2:
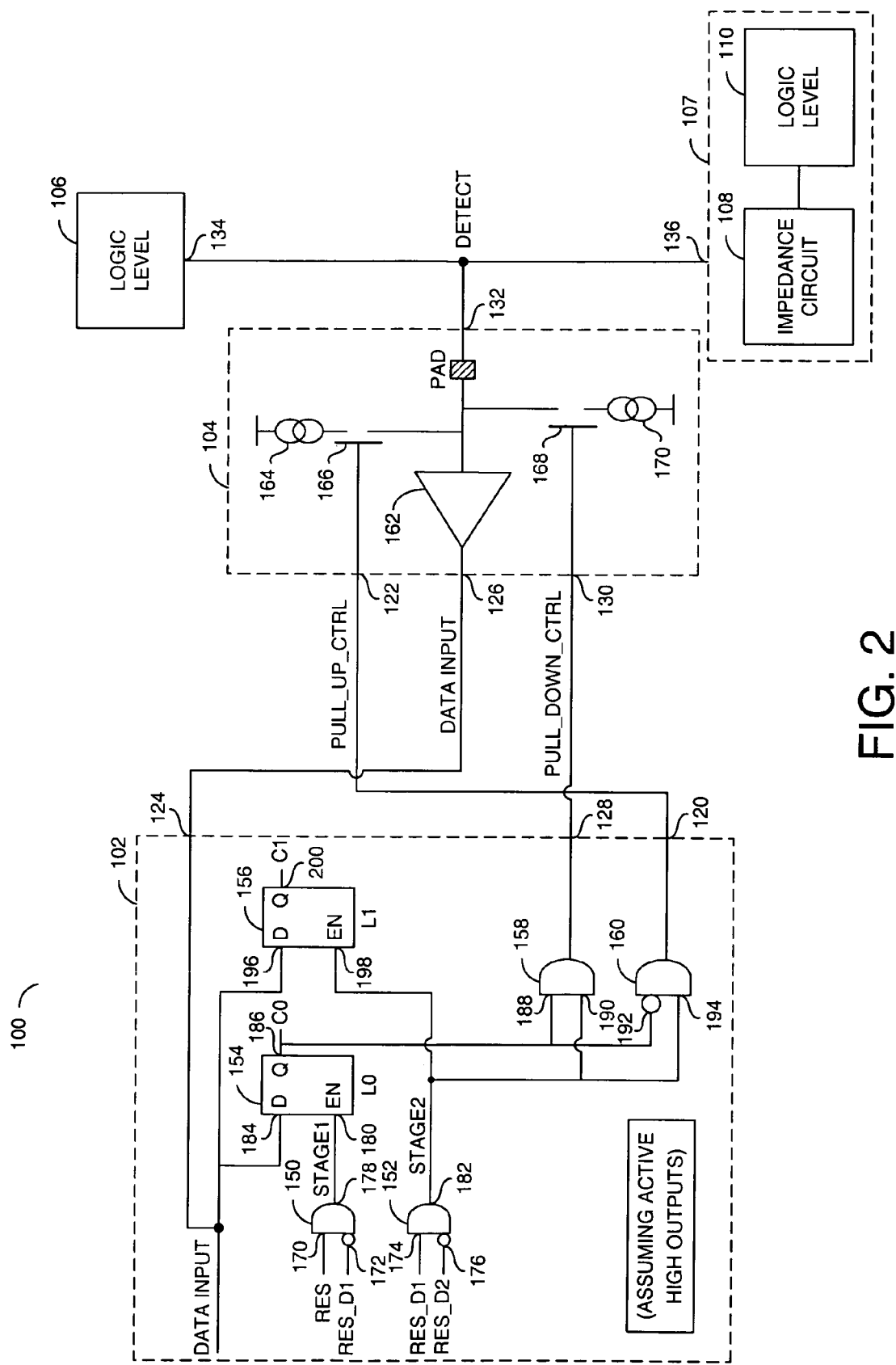
FIG. 2 is a more detailed diagram of the present invention.

Referring to FIG. 2, a more detailed block diagram of the system 100 is shown. The latching circuit 102 generally comprises a block (or circuit) 150, a block (or circuit) 152, a block (or circuit) 154, a block (or circuit) 156, a block (or circuit) 158 and a block (or circuit) 160. The circuit 150 may be implemented as a logic circuit. The circuit 152 may be implemented as a logic circuit. The logic circuits 150 and 152 may be implemented as AND gates. The type of logic circuit implemented may be varied to meet the design criteria of a particular implementation. The circuit 154 may be implemented as a latch. The circuit 156 may be implemented as a latch. In one example, the latches 154 and 156 may be implemented using D-type flip-flops. However, the particular type of flip-flop implemented may be varied to meet the design criteria of a particular implementation. The circuit 158 may be implemented as a logic circuit. The circuit 160 may be implemented as a logic circuit. In one example, the logic circuits 158 and 160 may be implemented using one or more AND gates. However, the type of logic circuit implemented may be varied to meet the design criteria of a particular implementation.

The input buffer circuit 104 generally comprises a block (or circuit) 162, a block (or circuit) 164, a block (or circuit) 166, a block (or circuit) 168, a block (or circuit) 170 and the input/output PAD. The circuit 162 may be implemented as a buffer circuit. The circuit 164 may be implemented as a current source. The circuit 166 may be implemented as a switch. The circuit 168 may be implemented as a switch. The circuit 170 may be implemented as a current source. The input buffer circuit 104 generally comprises a single input or input/output PAD.

The logic circuit 150 may have an input 170 that may receive a signal (e.g., RES), an input 172 that may receive a signal (e.g., RES_D1), and an output 178 that may present a signal (e.g., STAGE1). The input 172 may take the complement of the signal RES_D1. The logic circuit 152 may have an input 174 that may receive the signal RES_D1, an input 176 that may receive the signal (e.g., RES_D2) and an output 182 that may present a signal (e.g., STAGE2). The latch 154 may have an input 184 that may receive the signal DATA_INPUT, an input 180 that may receive the signal STAGE1 and an output 186 that may present a signal (e.g., C0). The latch 156 may have an input 196 that may receive the signal DATA_INPUT, an input 198 that may receive the signal STAGE2, and an output 200 that may present a signal (e.g., C1). The logic circuit 158 may have an input 188 that may receive the signal C0 and an input 190 that may receive the signal STAGE2. The logic circuit 160 may have an input 192 that may receive the signal C0 and an input 194 that may receive the signal STAGE2. The input 122 may couple the signal PULL_UP_CTRL to the switch 166. The input 126 may couple the signal DATA INPUT to the buffer 162. The input 130 may couple the signal PULL_DOWN_CTRL to the switch 168. The signal RES may be implemented as an external reset or a power on reset. The generation of the signals RES, RES_D1 and RES_D2 will be discussed in more detail in connection with FIG. 3.

To enable the configuration of multiple bits, the data input latching circuit 102 may use the signal RES to detect whether the input/output PAD is connected (i) directly to a logic level circuit 106 in a first state or (ii) to the logic level circuit 110 via the impedance circuit 108 in a second state. To allow for the configuration of multiple bits, the input buffer circuit 104 may include the switches 166 and 168 to allow for pull-up and pull-down control. The inputs 122 and 130 may be available in I/O cells (e.g., input buffer circuits) from a number of semiconductor vendor libraries.

To determine whether the input/output PAD is coupled directly to the logic level circuit 106 or to the logic level circuit 110 via the impedance circuit 108 during a reset sequence, the system 100 may perform a number of steps.

In a first step, the signal RES (or the power-on-reset) may be active. The signal PULL_UP_CTRL and PULL_DOWN_CTRL may be inactive by deactivating the signals RES_D1 and/or RES_D2. By inactivating the signals PULL_UP_CTRL and PULL_DOWN_CTRL, the impedance (high or low) between the logic level circuit 106 and the logic level circuit 110 may be read as the same. As the signal RESET is asserted, the buffer circuit 162 may transmit a first read value over the signal DATA_INPUT. The latch 154 may capture the read value when the signal RESET is deasserted.

In a second step, one of the current sources 164 and 170 may be controlled in response to the first read value sent over the signal DATA_INPUT. If the first read value captured by the latch 154 is high, the signal PULL_DOWN_CTRL may be activated. The switch 168 may be activated in response to the signal PULL_DOWN_CTRL being activated. The current source 170 may be activated in response to activating the switch 168. If the first read value captured by the latch 154 is low, the signal PULL_UP_CTRL may be activated. The switch 166 may be activated in response to the signal PULL_UP_CONTROL. The current source 168 may be activated in response to activating the switch 170. If a second read value captured by the latch 154 does not change in value from the first read value after the signal PULL_UP_CTRL or the signal PULL_DOWN_CTRL has been activated, the system 100 may determine that the input/output PAD may be directly connected to the logic level circuit 106. If the second read value captured by the latch 154 does change in value from the first read value after the signal PULL_UP_CTRL or the signal PULL_DOWN_CTRL has been activated, the system 100 may determine that the input/output PAD may be connected to the impedance circuit 108 and the logic level circuit 110.

For example, the first read value captured by the latch 154 may be the most significant bit (MSB) of a pair. The second read value captured by the latch 154 may be the least significant bit (LSB) of the pair. The operation of the present invention may proceed as follows:

(i) If the MSB is 1 and the LSB is 1, then (a) the input/output PAD may be directly connected to the logic level circuit 106 and (b) the logic level circuit 106 may be at a logic level of 1. Such a condition may indicate (i) the first read value captured by the latch 154 may be equal to 1, (ii) the second read value captured by the latch 154 may be equal to 1, and (iii) the signal PULL_DOWN_CTRL was activated;

(ii) If the MSB is 1, and the LSB is 0, then (a) the input/output PAD may be coupled to the impedance circuit 108 and to the logic level circuit 110, and (ii) the logic level circuit 110 may be at a logic level of 1. Such a condition may indicate (i) the first read value captured by the latch 154 may be equal to 1, (ii) the second read value captured by the latch 154 may be equal to 0 and (iii) the signal PULL_DOWN_CTRL was activated;

(iii) If the MSB is 0, and the LSB is 1, then (a) the input/output PAD may be coupled to the impedance circuit 108 and to the logic level circuit 110 and (b) the logic level circuit 110 may be at a logic level of 0. Such a condition may indicate (i) the first read value captured by the latch 154 may be equal to 0, (ii) the second read value captured by the latch 154 may be equal to 1 and (iii) the signal PULL_UP_CTRL was activated; and (iv) If the MSB is 0, and the LSB is 0, then (a) the input/output PAD may be directly coupled to the logic level circuit 106 and (ii) the logic level circuit 106 may be at the logic level of 0. Such a condition may indicate (i) the first read value captured by the latch 154 is equal to 0, (ii) the second read value captured by the latch 154 is 0, and (iii) the signal PULL_UP_CTRL was activated. The first read value detected by the latch 154 is indicative of the logic level (e.g., 0 or 1) for the logic level circuits 106 and 110.

The implementation of the latch 156 and the signal RES_D2 may reduce power consumption where extra modes are used for functional purposes instead of testing purposes. The latch 156 may be used to detect the extra modes. The latch 156 may be latched when the signal RES_D2 is activated. When the signal RES_D2 has been activated or deactivated, the signals PULL_UP_CTRL and PULL_DOWN_CTRL may be inactivated to prevent unnecessary current drain from the current sources 164 and 170. The system 100 may be released from reset in response to deactivating the signal RES_D2.

Figure 3:
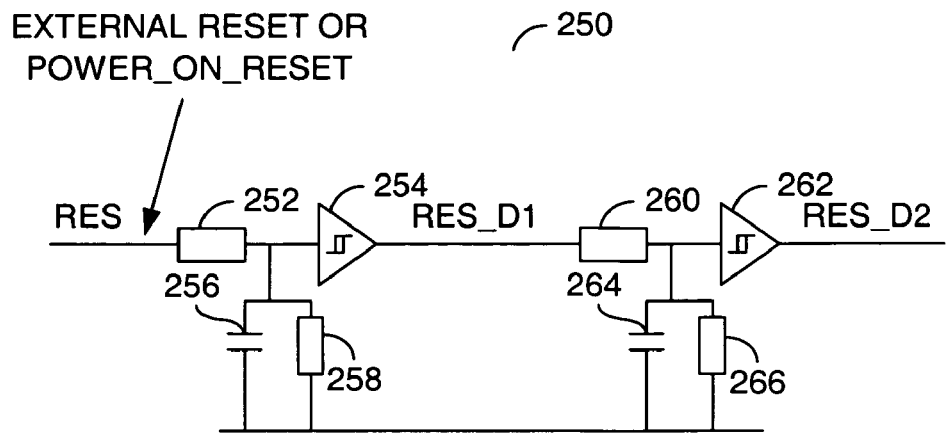
FIG. 3 is a diagram of a multi-stage reset generation circuit.

Referring to FIG. 3, an equivalent diagram of a multi-stage reset generation circuit 250 is shown. The reset generation circuit 250 generally comprises a resistor 252, a buffer circuit 254, a capacitor 256, a resistor 258, a resistor 260, a buffer 262, a capacitor 264 and a resistor 266. The buffer 254 may generate a first delay of the signal RES. The first delay of the signal RES may be defined as the signal RES_D1. The buffer 262 may generate a second delay of the signal RES_D1. The second delay of the signal RES_D1 may be defined as the signal RES_D2. The resistor 258 and 266 may discharge the capacitors 256 and 264 when there is no power applied to the circuit 250. When the signal RES is driven high or a power on reset drives the signal RES high in devices without an external reset pin, the capacitor 256 may be charged through the resistor 252. When the capacitor 252 reaches the threshold of the buffer 254, the signal RES_D2 may change from low to high and begin to charge the capacitor 264 via the resistor 260. The capacitor 264 may continue to be charged via the resistor 260 until the buffer 262 generates a high level on the signal RES-D2.

Figure 4:
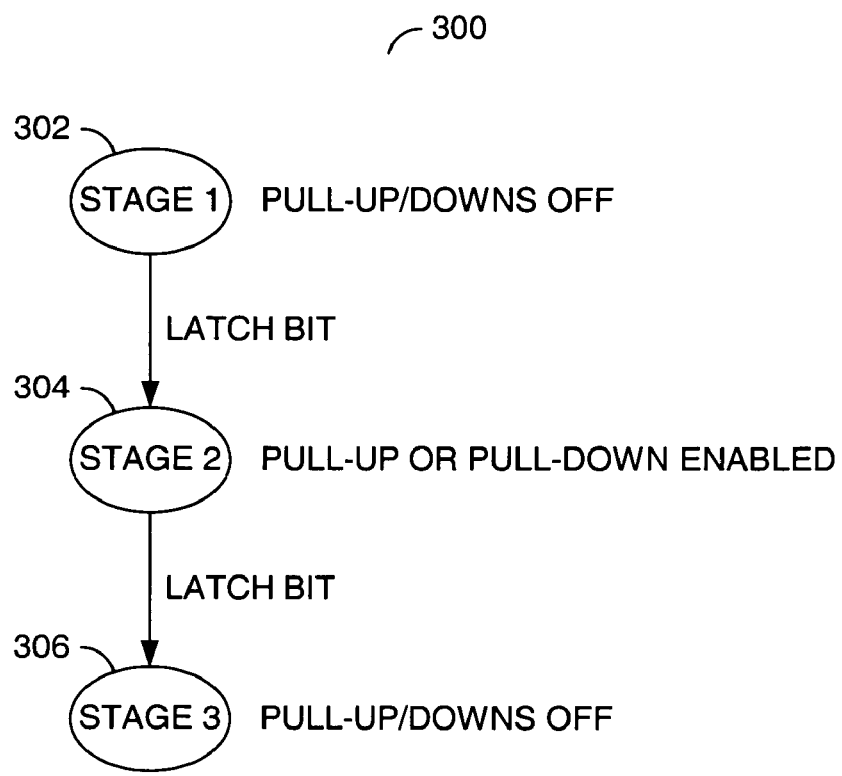
FIG. 4 is a state diagram of the present invention.
Figure 5:
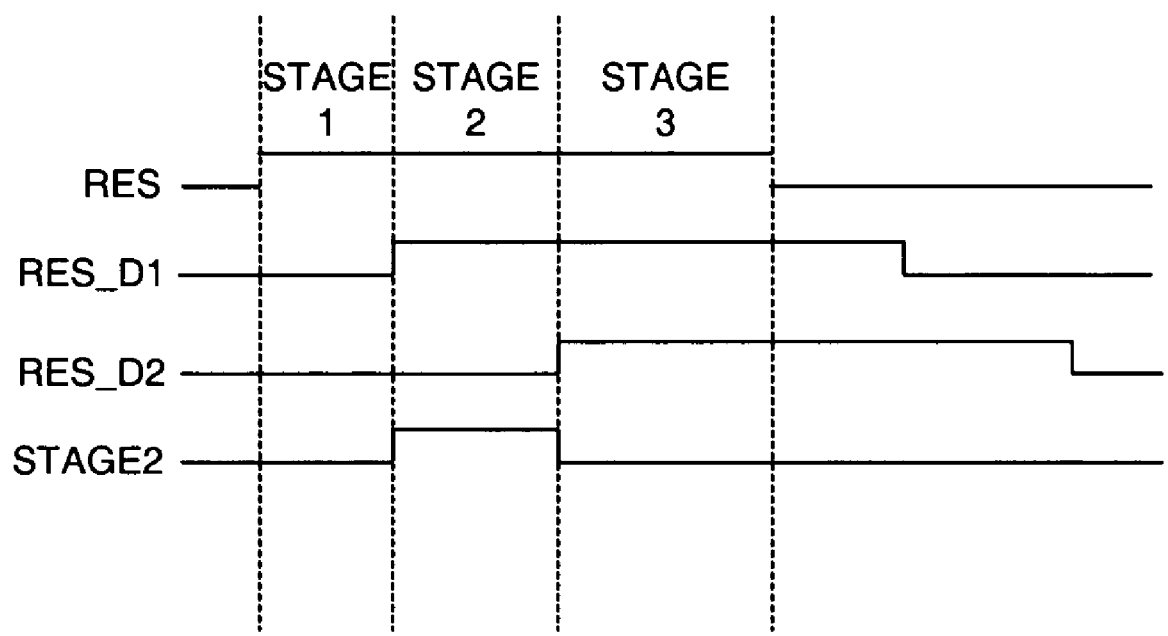
FIG. 5 is a diagram of reset signals in various states.

Referring to FIG. 4, a diagram illustrating a state machine 300 for the present invention is shown. The state machine 300 generally comprises a state 302, a state 304 and a state 306. The state 302 may be a stage 1. The state 304 may be a stage 2. The state 306 may be a stage 3. In the state 302, the signals PULL_UP_CTRL and PULL_DOWN_CTRL may be deactivated. FIG. 4 generally illustrates the status of the signals RES, RES_D1, RES_D2 and STAGE 2 during various states. In the state 302, the signal RES may be activated and the signals RES_D1, RES_D2 and STAGE 2 may be deactivated to disable the signals PULL_UP_CTRL and PULL_DOWN_CTRL. The state machine 300 may move to the state 304 in response to the signal RES_D1 going high, at which time the latch 154 may capture the first read value. The state 304 may enable the signals PULL_UP_CTRL or PULL_DOWN_CTRL based on the value of the first read value. In the state 304, the signals RES, RES_D1 and STAGE2 may be activated and the signal RES_D2 may be deactivated.

The state machine 300 moves to the state 306 in response to the signal RES_D2 going high, at which time, the latch 154 captures the second read value. The state 306 may disable the signals PULL_UP_CTRL and PULL_DOWN_CTRL. In the state 306, the signals RES, RES_D1 and RES_D2 may be enabled and the signal STAGE2 may be disabled. By disabling the signal STAGE 2, the signals PULL_UP_CTRL and PULL_DOWN_CTRL may be deactivated. The state machine 300 may operate during device reset or at power up to latch a logic level in the logic level circuit 108 or 110.

The present invention generally allows the input/output PAD to be high or low. The system 100 may allow for an increase in states. For example, the states may be increased from high or low to pull-up, pull-down, high or low. Such an increase in states may be detected via the on-chip control of the signals PULL_UP_CTRL and PULL_DOWN_CTRL. The present invention may monitor the signal level on the input/output PAD while controlling the signals PULL_UP_CTRL and PULL_DOWN_CTRL. The input/output PAD may be used to provide configuration states. By connecting the input/output PAD to the logic level circuit 106 or to the logic level circuit 110 via the impedance circuit 108, the system 100 may reduce the number of configuration pins (or input/output PADs) needed on the input buffer circuit 104.

The function performed by the state machine of FIG. 4 may be implemented using a conventional general purpose digital computer programmed according to the teachings of the present specification, as will be apparent to those skilled in the relevant art(s). Appropriate software coding can readily be prepared by skilled programmers based on the teachings of the present disclosure, as will also be apparent to those skilled in the relevant art(s).

The present invention may also be implemented by the preparation of ASICs, FPGAs, or by interconnecting an appropriate network of conventional component circuits, as is described herein, modifications of which will be readily apparent to those skilled in the art(s).

The present invention thus may also include a computer product which may be a storage medium including instructions which can be used to program a computer to perform a process in accordance with the present invention. The storage medium can include, but is not limited to, any type of disk including floppy disk, optical disk, CD-ROM, magneto-optical disks, ROMs, RAMs, EPROMs, EEPROMs, Flash memory, magnetic or optical cards, or any type of media suitable for storing electronic instructions.

While the invention has been particularly shown and described with reference to the preferred embodiments thereof, it will be understood by those skilled in the art that various changes in form and details may be made without departing from the scope of the invention.

The invention claimed is:

1. An apparatus comprising:
 a first circuit configured to generate a data input signal in response to a first control signal and a second control signal; and
 a second circuit configured to (i) generate said first control signal and said second control signal and (ii) determine whether said first circuit is coupled to (a) a first logic level circuit when in a first state and (b) an impedance circuit and a second logic level circuit when in a second state.

2. The apparatus according to claim 1, wherein said apparatus further comprises:
 a reset generation circuit configured to generate one or more reset signals.

3. The apparatus according to claim 2, wherein said second circuit further comprises:
 a first latch configured to capture a first read value on said data input signal in response to said one or more reset signals.

4. The apparatus according to claim 3, wherein said second circuit is configured to deactivate said first control signal and said second control signal in response to activating said one or more reset signals.

5. The apparatus according to claim 4, wherein said second circuit activates said first control signal (a) in response to deactivating said one or more reset signals and (b) if said first read value is a high value.

6. The apparatus according to claim 5, wherein said second circuit activates said second control signal (a) in response to deactivating said one or more reset signals and (b) if said first read value is a low value.

7. The apparatus according to claim 6, wherein said second circuit further comprises:
   a second latch configured to capture a second read value on said data input signal in response to said first circuit reacting to said first control signal and said second control signal.

8. The apparatus according to claim 7, wherein said second circuit determines that said first circuit is coupled to said first logic level circuit in said first state if said first read value and said second read value are equal in value.

9. The apparatus according to claim 8, wherein said second circuit determines that said first circuit is coupled to said second logic level circuit and said impedance circuit if said first read value and said second read value differ in value.

10. The apparatus according to claim 1, wherein said first circuit further comprises:
    a pad configured to couple said first circuit to (i) said first logic level circuit in said first state and (ii) said second logic level and said impedance circuit in said second state.

11. The apparatus according to claim 10, wherein said pad is configured to provide multi-bit configurations.

12. The apparatus according to claim 1, wherein said first circuit comprises:
    one or more latches configured to (i) receive said data input signal and (ii) determine whether said first circuit is coupled to (a) said first logic level circuit in said first state and (b) said impedance circuit and said second logic level circuit in said second state;
    one or more first logic circuits configured to enable said one or more latches in response to one or more reset signals;
    one or more second logic circuits configured to present said first control signal and said second control signal in response to an output of said one or more latches and an output of said one or more reset signals; and
    said one or more reset signals comprise a first reset signal, a first delay reset signal and a second delay reset signal.

13. The apparatus according to claim 1, wherein said second circuit comprises:
    a buffer configured to present said data input signal;
    a first switch configured to receive said first control signal;
    a second switch configured to receive said second control signal;
    a first current source coupled to said first switch; and
    a second current source coupled to said second switch.

14. An apparatus comprising:
    means for generating a data input signal in response to a first control signal and a second control signal; and
    means for generating said first control signal and second control signal; and
    means for determining whether said means for generating is coupled to (a) a first logic level circuit when in a first state and (b) an impedance circuit and a second logic level circuit when in a second state.

15. A method for configuring multi-bit pins:
    (A) generating a data input signal with a first circuit in response to a first control signal and a second control signal;
    (B) generating said first control signal and second control signal with a second circuit; and
    (C) determining whether said first circuit is coupled to (a) a first logic level circuit when in a first state and (b) an impedance circuit and a second logic level circuit when in a second state.

16. The method according to claim 15, further comprising the step of:
    generating one or more reset signals.

17. The method according to claim 16, further comprising the steps of:
    deactivating said first control signal and said second control signal in response to activating said one or more reset signals; and
    capturing a first read value on said data input signal in response to said one or more reset signals.

18. The method according to claim 17, further comprising the steps of:
    activating said first control signal (a) in response to deactivating said one or more reset signals and (b) when said first read value is a high value; and
    activating said second control signal (a) in response to deactivating said one or more reset signals and (b) when said first read value is a low value.

19. The method according to claim 18, further comprising the steps of:
    capturing a second read value on said data input signal in response to said first circuit reacting to said first control signal or said second control signal.

20. The method according to claim 19, further comprising the steps of:
    determining that said first circuit is coupled to said first logic level circuit in said first state if said first read value and said second read value are equal in value; and
    determining that said first circuit is coupled to said second logic level circuit and said impedance circuit if said first read value and said second read value differ in value.

* * * * *